s010061201B2

United States Patent
Yang et al.

(10) Patent No.: US 10,061,201 B2
(45) Date of Patent: Aug. 28, 2018

(54) BOTTOM UP APPARATUS DESIGN FOR FORMATION OF SELF-PROPAGATING PHOTOPOLYMER WAVEGUIDES

(71) Applicant: HRL Laboratories, LLC, Malibu, CA (US)

(72) Inventors: Sophia S. Yang, Lynnwood, WA (US); Alan J. Jacobsen, Woodland Hills, CA (US); Joanna A. Kolodziejska, Oak Park, CA (US); Robert E. Doty, Los Angeles, CA (US); William Carter, Calabasas, CA (US); Jacob M. Hundley, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/333,117

(22) Filed: Oct. 24, 2016

(65) Prior Publication Data
US 2018/0113385 A1    Apr. 26, 2018

(51) Int. Cl.
*G03F 7/20*    (2006.01)
*G02B 6/138*    (2006.01)

(52) U.S. Cl.
CPC ......... *G03F 7/70058* (2013.01); *G02B 6/138* (2013.01)

(58) Field of Classification Search
CPC ....... G03F 7/70; G03F 7/70058; G02B 6/138; G02B 1/12; B29C 67/00
USPC .................................................. 425/174.4
See application file for complete search history.

(56) References Cited

U.S. PATENT DOCUMENTS

| 7,382,959 | B1 | 6/2008 | Jacobsen |
| 7,938,989 | B1 | 5/2011 | Gross et al. |
| 8,367,306 | B1 | 2/2013 | Doty et al. |
| 2006/0082745 | A1 | 4/2006 | Lipson et al. |
| 2011/0091813 | A1 | 4/2011 | Lai et al. |
| 2015/0029717 | A1 | 1/2015 | Shen et al. |

(Continued)

FOREIGN PATENT DOCUMENTS

WO    WO 2014/126837 A2    8/2014

OTHER PUBLICATIONS

Doty, Robert E. et al. "Hierarchical Polymer Microlattice Structures", Advanced Engineering Materials, 2012, pp. 1-5.
(Continued)

*Primary Examiner* — Alison L Hindenlang
*Assistant Examiner* — Yunju Kim
(74) *Attorney, Agent, or Firm* — Lewis Roca Rothgerber Christie LLP

(57) ABSTRACT

A system for fabricating micro-truss structures. A reservoir holds a volume of a liquid photomonomer configured to polymerize to form a photopolymer when exposed to suitable light such as ultraviolet light. A mask at the bottom of the reservoir includes a plurality of apertures. Light enters the reservoir through each aperture from several directions, forming a plurality of self-guided photopolymer waveguides within the reservoir. The light is supplied by one or more sources of collimated light. A plurality of mirrors may reflect the light from a single source of collimated light to form a plurality of collimated beams, that illuminate the photomonomer in the reservoir, through the mask, from a corresponding plurality of directions, to form a micro-truss structure including a plurality of self-guided waveguide members.

4 Claims, 14 Drawing Sheets

(56) References Cited

U.S. PATENT DOCUMENTS

2015/0111158 A1    4/2015  Schmaelzle et al.
2015/0176132 A1*   6/2015  Hundley ................ G02B 1/12
                                                    428/116
2017/0036398 A1*   2/2017  Gumennik .......... B29C 67/0066

OTHER PUBLICATIONS

International Search Report and Written Opinion for corresponding Application No. PCT/US16/58953, dated Jan. 19, 2017 (9 pages).

\* cited by examiner

BOTTOM UP APPARATUS DESIGN FOR FORMATION OF SELF-PROPAGATING PHOTOPOLYMER WAVEGUIDES

CROSS-REFERENCE TO RELATED APPLICATION(S)

The present application is related to U.S. Pat. No. 7,382,959 ("the '959 Patent") and U.S. Pat. No. 7,938,989 ("the '989 Patent"), the entire contents of both of which are incorporated herein by reference.

FIELD

One or more aspects of embodiments according to the present invention relate to a system and method for fabricating micro-truss structures, and more particularly to a system and method for forming such structures from the bottom up.

BACKGROUND

Micro-truss structures, such as those disclosed in the '989 patent, have numerous applications. The fabrication method disclosed in the '989 patent involves forming micro-truss structures by exposing a suitable liquid photomonomer to collimated light through one or more photomasks. Such a liquid photomonomer may undergo a refractive index change during a photo-polymerization process, which may lead to a formation of polymer optical waveguides. If a monomer that is photo-sensitive is exposed to light (e.g., ultraviolet (UV) light) under the right conditions, the initial area of polymerization, such as a small circular area, will "trap" the light and guide it to the tip of the polymerized region, further advancing that polymerized region. This process will continue, leading to the formation of a waveguide structure with approximately, or about, the same cross-sectional dimensions along its entire length. A photomask with a two-dimensional pattern of apertures may be used to create a three-dimensional polymer microstructure, when a tray of photomonomer is illuminated from above, through the photomask, by collimated light from several different directions.

A micro-truss structure may be formed from the top down, by illuminating the liquid photomonomer to collimated light from above, through one or more photomasks positioned above the liquid photomonomer.

In some circumstances it may be advantageous to grow a micro-truss structure from the bottom up, and, thus, there is a need for a system for forming a micro-truss structure from the bottom up.

SUMMARY

Aspects of embodiments of the present disclosure are directed toward a system for fabricating micro-truss structures. A reservoir holds a volume of a liquid photomonomer configured to polymerize to form a photopolymer when exposed to suitable light such as ultraviolet light. A mask at the bottom of the reservoir includes a plurality of apertures. Light enters the reservoir through each aperture from several directions, forming a plurality of self-guided photopolymer waveguides within the reservoir. The light is supplied by one or more sources of collimated light. A plurality of mirrors may reflect the light from a single source of collimated light to form a plurality of collimated beams, that illuminate the photomonomer in the reservoir, through the mask, from a corresponding plurality of directions, to form, in the reservoir, a micro-truss structure including a plurality of self-guided waveguide members.

According to an embodiment of the present invention there is provided a system for forming a micro-truss structure, the system including: a reservoir having walls and a flat bottom, configured to hold a volume of a liquid photomonomer, the photomonomer being configured to form a photopolymer when exposed to light; a partially transparent mask secured to, or being, the bottom of the reservoir; a release layer on the mask, the release layer being configured to resist adhesion by the photopolymer; a blocker positioned a first distance below the mask; a light source positioned below the blocker, configured to produce collimated light suitable for causing conversion of the photomonomer into the photopolymer, and to which the blocker is opaque; and a first mirror, oblique to the blocker, configured to reflect the light from the light source around the blocker and through the mask and into the reservoir, the blocker being positioned to block a straight path of light from the light source to the mask.

In one embodiment, the release layer includes, as a major component, a compound selected from the group consisting of sprayable mold release compounds, polyvinyl chlorides, polyvinylidene chlorides, and combinations thereof.

In one embodiment, the mask is the bottom of the reservoir.

In one embodiment, the bottom of the reservoir is composed of the same material as the walls of the reservoir, and the bottom of the reservoir is integral with the walls of the reservoir.

In one embodiment, the release layer includes, as a major component, a compound selected from the group consisting of polyvinyl chlorides, polyvinylidene chlorides, and combinations thereof, and wherein the release layer is the bottom of the reservoir.

In one embodiment, the system includes a substrate on the release layer, the substrate being a flat sheet configured to become part of the micro-truss structure, the substrate including, as a major component, a compound selected from the group consisting of acrylic, polyethylene terephthalate, and combinations thereof.

In one embodiment, the release layer includes, as a major component, a compound selected from the group consisting of sprayable mold release compounds, polyvinyl chlorides, polyvinylidene chlorides, and combinations thereof.

In one embodiment, the mask is the bottom of the reservoir.

In one embodiment, the system includes, as a major component, a material selected from the group consisting of polyvinyl chlorides, polyvinylidene chlorides, paraformaldehydes, fluorinated ethylene propylenes, polyvinylidene fluorides, polytetrafluoroethylene, polyesters, poly(methyl methacrylate), polyethylene terephthalate, UV transparent glasses, and combinations thereof; and an opaque coating on the flat sheet, the opaque coating having a plurality of apertures.

In one embodiment, the opaque coating includes, as a major component, a metal or alloy.

In one embodiment, the system includes a housing below the bottom of the reservoir, configured to hold the mask, and configured to permit removal and/or insertion of the mask without disturbing the reservoir or its contents.

In one embodiment, the blocker is positioned to block every straight path of light from the light source to the mask.

In one embodiment, the system includes a second mirror, wherein: the mask is square, the first mirror has an upper edge adjacent to a first edge of the mask, and the second mirror has an upper edge adjacent to a second edge of the mask, opposite the first edge.

In one embodiment, the upper edge of the first mirror is at the same height as the upper edge of the second mirror, and the upper edge of the first mirror is parallel to the upper edge of the second mirror.

In one embodiment, an angle of depression of the second mirror is the same as an angle of depression of the first mirror.

In one embodiment, a gap between the upper edge of the first mirror and the first edge of the mask has a maximum width less than 5 mm, and a gap between the upper edge of the second mirror and the second edge of the mask has a maximum width less than 5 mm.

In one embodiment, the light source is selected from the group consisting of arrays of light-emitting diodes, mercury arc lamps, lasers, and combinations thereof.

According to an embodiment of the present invention there is provided a system for forming a micro-truss structure, the system including: a reservoir having walls and a flat bottom, configured to hold a volume of a liquid photomonomer, the photomonomer being configured to form a photopolymer when exposed to light; a partially transparent mask secured to, or being, the bottom of the reservoir; a release layer on the mask, the release layer being configured to resist adhesion by the photopolymer; a first light source configured to radiate collimated light, suitable for causing conversion of the photomonomer into the photopolymer, vertically downward; a first mirror, configured to reflect light from the first light source into a first direction; a second mirror, configured to reflect light from the first direction into a second direction that is neither vertical nor horizontal, through the mask and into the reservoir; a second light source configured to radiate collimated light, suitable for causing conversion of the photomonomer into the photopolymer, vertically downward; and a third mirror, configured to reflect light from the second light source into a third direction, the second mirror being further configured to reflect light from the third direction into a fourth direction that is neither vertical nor horizontal, through the mask and into the reservoir, a plane containing the second direction and the fourth direction being vertical, and an elevation angle of the fourth direction being the same as an elevation angle of the second direction.

In one embodiment, the system includes: a third light source configured to radiate collimated light, suitable for causing conversion of the photomonomer into the photopolymer, vertically downward; a fourth mirror, configured to reflect light from the third light source into a fifth direction; a fourth light source configured to radiate collimated light, suitable for causing conversion of the photomonomer into the photopolymer, vertically downward; and a fifth mirror, configured to reflect light from the fourth light source, into a sixth direction, the second mirror being further configured: to reflect the light from the fifth direction into a seventh direction that is neither vertical nor horizontal, through the mask and into the reservoir, and to reflect the light from the third direction into an eighth direction that is neither vertical nor horizontal, through the mask and into the reservoir, a plane containing the seventh direction and the eighth direction being vertical, and an elevation angle of the seventh direction being the same as an elevation angle of the eighth direction.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a bottom up apparatus design for formation of self-propagating photopolymer waveguides provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
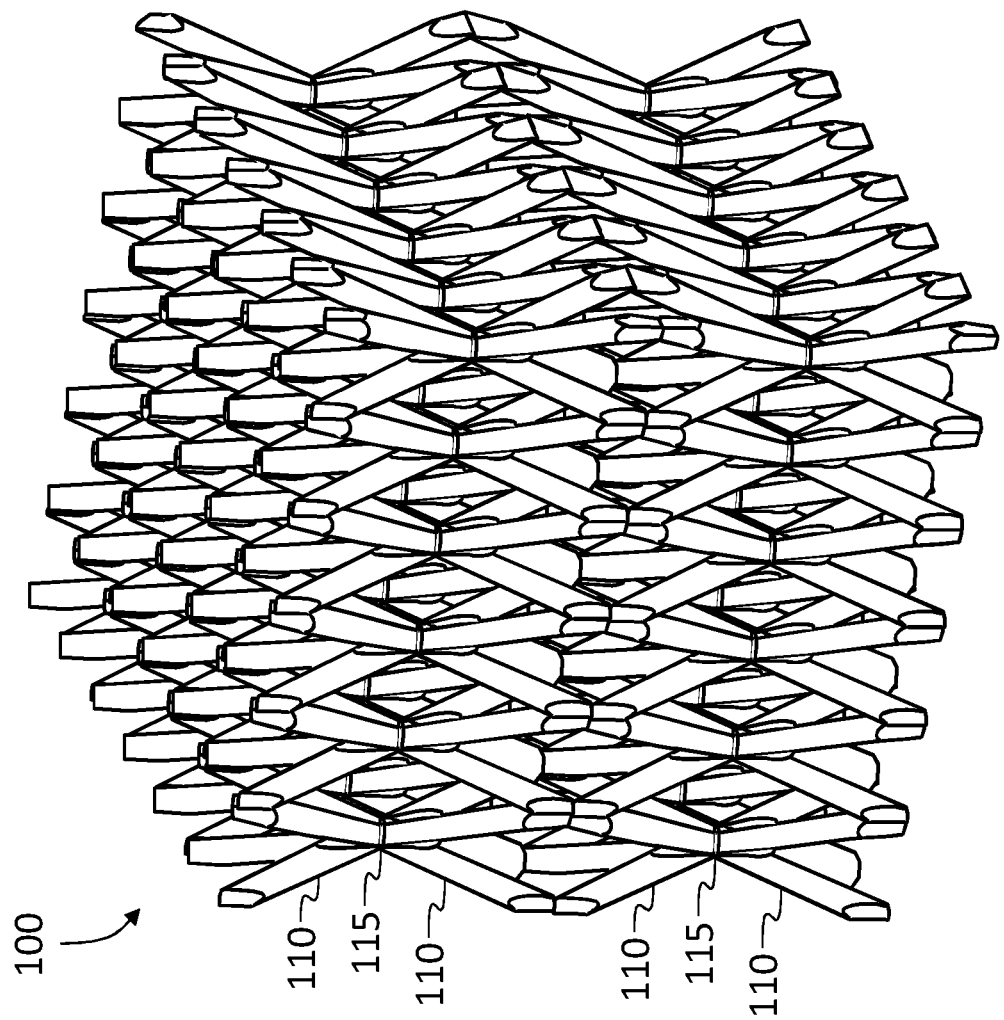
FIG. 1A is a perspective view of a micro-truss structure according to an embodiment of the present invention.
Figure 1B:
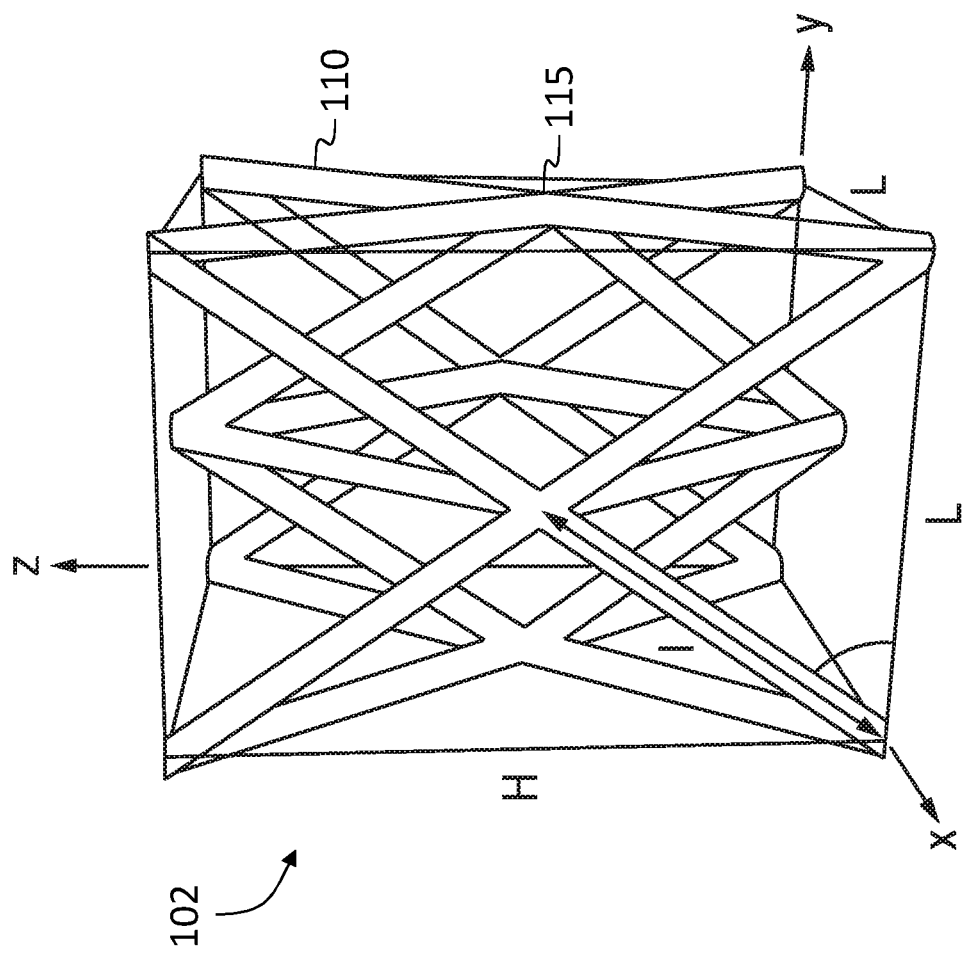
FIG. 1B is a perspective view of a unit cell of a micro-truss structure, according to an embodiment of the present invention.
Figure 1C:
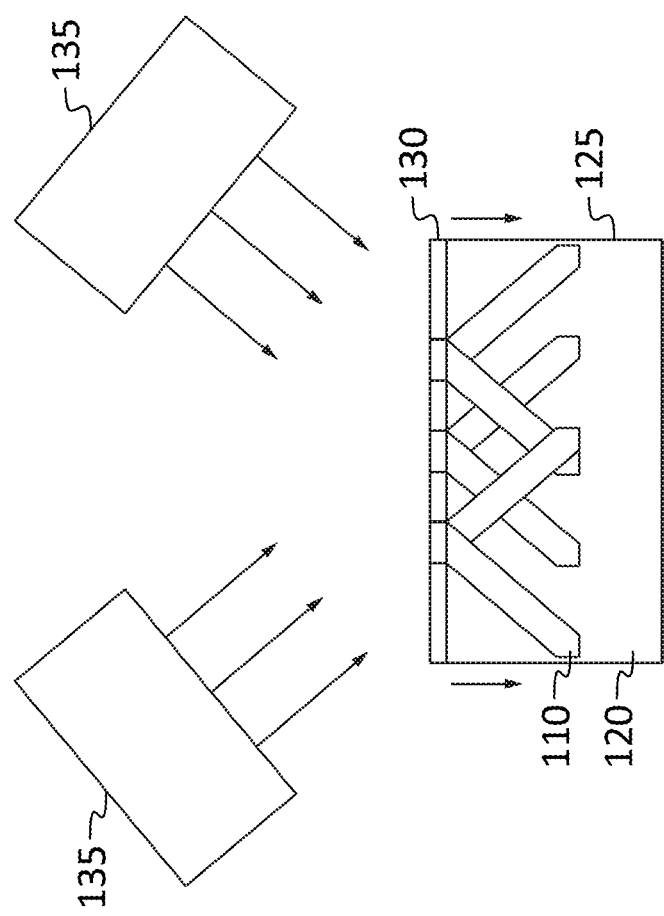
FIG. 1C is a side view of a system for forming a micro-truss structure, according to an embodiment of the present invention.

FIG. 1A and FIG. 1B show, respectively, a representative micro-truss material 100 and a representative micro-truss unit cell 102. In limited thicknesses (where thickness is used herein to refer to the direction that is vertical during fabrication, and corresponds to the Z-axis of FIG. 1B), such structures may be fabricated by a self-guided, or "self propagating" photo-polymerization process, as described in the '989 patent and in the '959 patent, and as illustrated in FIG. 1C. A photomonomer may undergo a refractive index change during the polymerization process, which can lead to the formation of optical waveguides composed of the resulting polymer, referred to herein as the "photopolymer". If a photomonomer resin 120 that is photo-sensitive (e.g., a photomonomer resin 120 in a reservoir 125) is exposed through a mask 130 to collimated light (e.g., collimated ultraviolet (UV) light) from one or more light sources 135, the initial area of polymerization, such as a small circular area, may "trap" the light and guide it to the tip of the polymerized region, further advancing that polymerized region. This process may continue, leading to the formation of a photopolymer waveguide structure with approximately or about the same cross-sectional dimensions along its entire length. The waveguides may interpenetrate at nodes 115, resulting in a structure including waveguide members 110 joined at the nodes 115. In one embodiment the nodes are not perturbed dimensionally by the change in index of refraction resulting from the photo-polymerization process, i.e., the nodes do not swell up, or have a local diameter exceeding the diameter of the waveguides 110 that meet at the nodes.

Figure 1D:
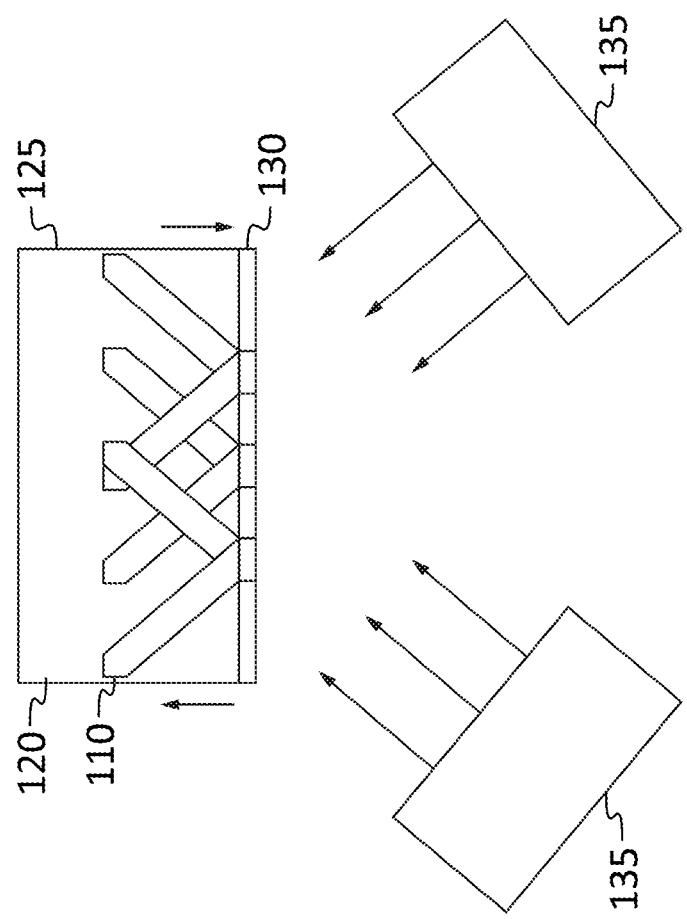
FIG. 1D is a side view of a system for forming a micro-truss structure, according to an embodiment of the present invention.

In the embodiment of FIG. 1C, the direction of gravity is the same as the direction of structure growth; both are downward. Referring to FIG. 1D, in one embodiment, a reservoir 125 of photomonomer resin 120 is illuminated from below, by one or more light sources 135 below the reservoir 125. In this embodiment the direction of structure growth is upward, opposite to the direction of gravity. The mask 130 is at the bottom of the reservoir 125.

Figure 2A:
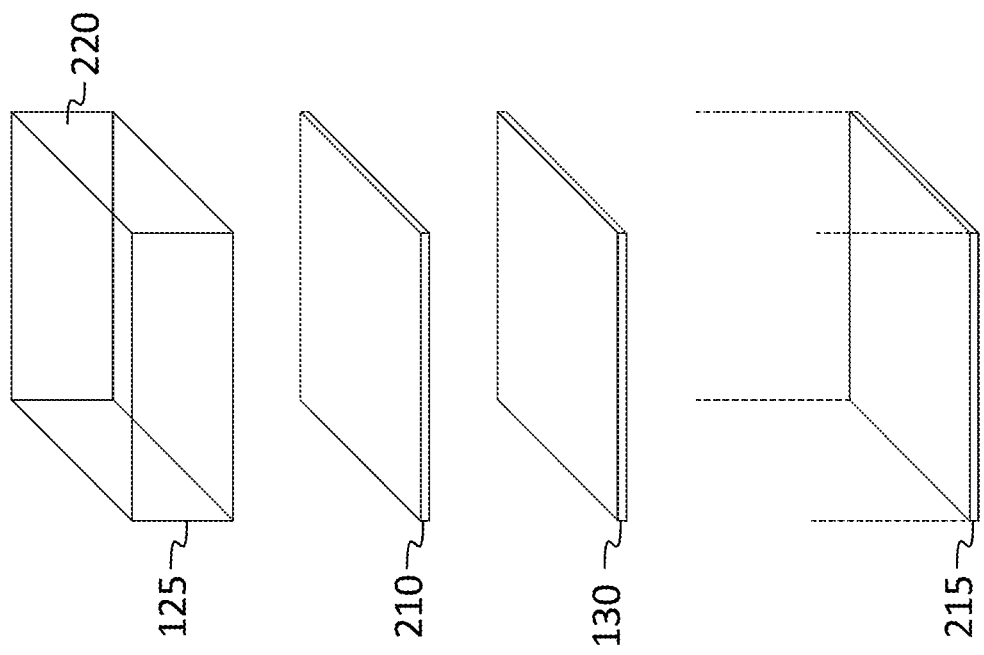
FIG. 2A is an exploded perspective view of a portion of an apparatus for fabricating a micro-truss structure, according to an embodiment of the present invention.

Referring to FIG. 2A, in some embodiments an apparatus for fabricating a micro-truss structure includes a reservoir 125, a substrate 210, the mask 130, and a blocker 215. The reservoir may include four walls 220, and may include an integral transparent (e.g., UV transparent) bottom, or it may lack an integral bottom. If the reservoir 125 does not include an integral bottom, then the substrate 210 or the mask 130 may be sealed to the bottom edges of the reservoir walls, forming the bottom of the reservoir, to allow it to retain the photomonomer resin 120. For example, the substrate may be sealed to the bottom of the reservoir walls with vacuum grease or with another suitable sealant (e.g., adhesive tape). In such an embodiment the mask 130 may be secured to the bottom of the substrate 210. In other embodiments the mask 130 may be sealed to the bottom of the reservoir walls with vacuum grease or with another suitable sealant, and the substrate 210 may be sufficiently small to fit inside the reservoir 125 and to rest on the bottom of the reservoir, i.e., on the mask 130.

The substrate 210 may be transparent to the light (e.g., UV light) used to form the micro-truss structure, and it may become a part of the completed micro-truss structure, e.g., forming a face sheet on the micro-truss structure. In embodiments in which a substrate 210 is not intended to become a part of the completed micro-truss structure, the substrate may be absent.

A "release layer", i.e., a layer that is configured to release the micro-truss structure after formation, may be used on the bottom of the reservoir 125 so that the micro-truss structure may be lifted out of the reservoir 125 after fabrication. The release layer may be a cover sheet composed of (e.g., including, as a major component) a transparent (e.g., UV-transparent) material to which the polymer of the micro-truss structure does not adhere, such as polyvinyl chloride (PVC), or polyvinylidene chloride (PVDC) (e.g., PVDC film). In some embodiments, a mask cover sheet composed of another material (which may not itself avoid adhesion by the photopolymer) is used as a carrier for the release layer, and the mask cover sheet is coated with a suitable mold-release (e.g., a sprayable mold release compound is sprayed on to it), before the photomonomer resin 120 is poured into the reservoir 125, to prevent the micro-truss structure from adhering to the mask cover sheet. In such an embodiment, the mold release compound may be the release layer. In some embodiments the bottom of the reservoir 125 (or the entire reservoir 125) is composed of (e.g., includes, as a major component) a material to which the polymer of the micro-truss structure does not adhere, and the bottom of the reservoir 125 is the release layer. In some embodiments the mold release compound includes, as a major component, a silicon base compound and/or a fluorine base compound, e.g., polytetrafluoroethylene (PTFE) and/or a silicone oil. In some embodiments the mold release compound is SPRAYON™ MR314.

In embodiments in which a substrate 210 is used and intended to become a part of the completed micro-truss structure, it may be composed of (e.g., it may include, as a major component) a material to which the polymer of the micro-truss structure readily adheres, such as acrylic or polyethylene terephthalate (PET). In such an embodiment, if the substrate 210 is placed inside the reservoir 125 and another element (e.g., the mask, or an part that is integral with the reservoir walls 220) forms the bottom of the reservoir 125, measures may be taken to avoid allowing photomonomer that may enter a gap between the top surface of the bottom of the reservoir 125 and the bottom surface of the substrate 210 from polymerizing and acting as an adhesive joining the top surface of the bottom of the reservoir 125 and the bottom surface of the substrate 210. Such measures may include the use of a release layer (e.g., a layer of sprayed sprayable mold release compound, or a film of polyvinylidene chloride) positioned or formed on the bottom of the reservoir 125 and under the bottom surface of the substrate 210.

The mask 130 may be formed as a sheet of opaque material with a plurality of holes (e.g., a sheet of aluminum or steel, with, e.g., laser-cut holes), the holes being regularly arranged with a spacing corresponding to the unit cell size of the micro-truss structure, and each hole having a shape corresponding to a cross-section of the waveguide members 110. In some embodiments, the mask 130 includes (e.g., as a major component) a flat sheet of a transparent (e.g., UV transparent) material (such as paraformaldehyde (PFA), fluorinated ethylene propylene (FEP), polyvinylidene fluoride (PVDF), polytetrafluoroethylene (PTFE), polyesters, poly(methyl methacrylate) (PMMA), polyethylene terephthalate (PET), polyvinyl chloride (PVC), or UV transparent glass), partially metallized with a coating composed of (e.g., including, as a major component) metal (e.g., chrome) or alloy and having holes or openings through which the collimated light may pass to form the waveguide members 110. The mask 130 may be the bottom of the reservoir 125, or it may be secured to the lower side of the reservoir 125, e.g., in a housing below the reservoir, permitting the removal and/or replacement of the mask 130 without disturbing the reservoir 125 or its contents. The bottom of the reservoir, whether it is the mask or another element, or integral with the walls of the reservoir, may be composed of any transparent (e.g., UV transparent) material that is suitable for containing (e.g., not dissolved by) the photomonomer resin 120.

Figure 2B:
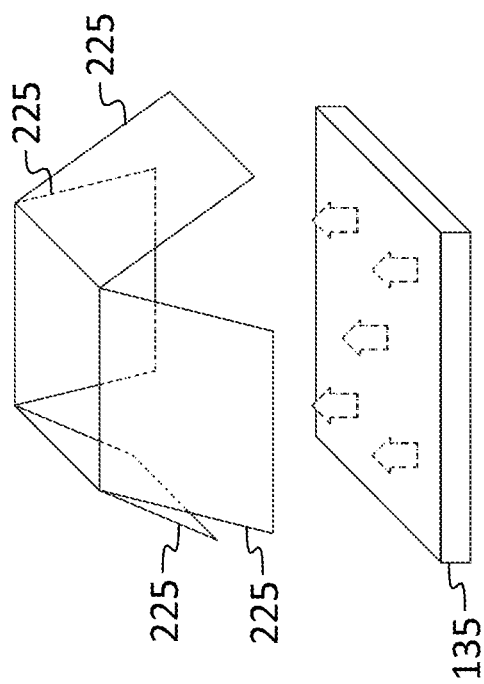
FIG. 2B is an exploded perspective view of a portion of an apparatus for fabricating a micro-truss structure, according to an embodiment of the present invention.

Referring to FIG. 2B, in some embodiments, the apparatus further includes a plurality of mirrors 225, and a collimated light source 135. Each of the mirrors 225 may be a flat mirror oblique to the vertical direction, i.e., a vector that is normal to its surface may be oblique to the direction of gravity. Each mirror 225 may be of any kind suitable for reflecting collimated light produced by the collimated light source 135. In some embodiments, the collimated light source 135 produces ultraviolet light and each mirror 225 includes a plate (e.g., a plate of glass) with a flat surface, and a reflective coating on the plate, e.g., a metal coating (such as a coating of aluminum, gold, or silver) or a dielectric coating (e.g., a multilayer dielectric coating) formed on the flat surface of the plate. If the plate is opaque to the collimated light, then the side of the reflective coating facing away from the plate may be used as the reflective surface of the mirror; such a mirror may be referred to as a first surface mirror. In other embodiments the plate is transparent and light reflects from the other surface of the reflective coating (i.e., from the surface facing the plate), after travelling through the plate, and then travels through the plate again after reflecting. Such a mirror may be referred to as a second surface mirror.

The apparatus may include four mirrors as illustrated in FIG. 2B, if for example, it is intended to be used to fabricate micro-truss structures having waveguide members 110 extending in four different directions. In other embodiments, a different number of mirrors may be used. Accordingly, a reservoir 125 may be used with three mirrors to form micro-truss structures having waveguide members 110 extending in three different directions.

The collimated light source 135 may be an array of light-emitting diodes (LEDs), a mercury arc lamp, a laser (e.g., an ultraviolet laser) or any other source of collimated light at a wavelength (e.g., at an ultraviolet wavelength) suitable for causing the photomonomer to polymerize.

Figure 3A:
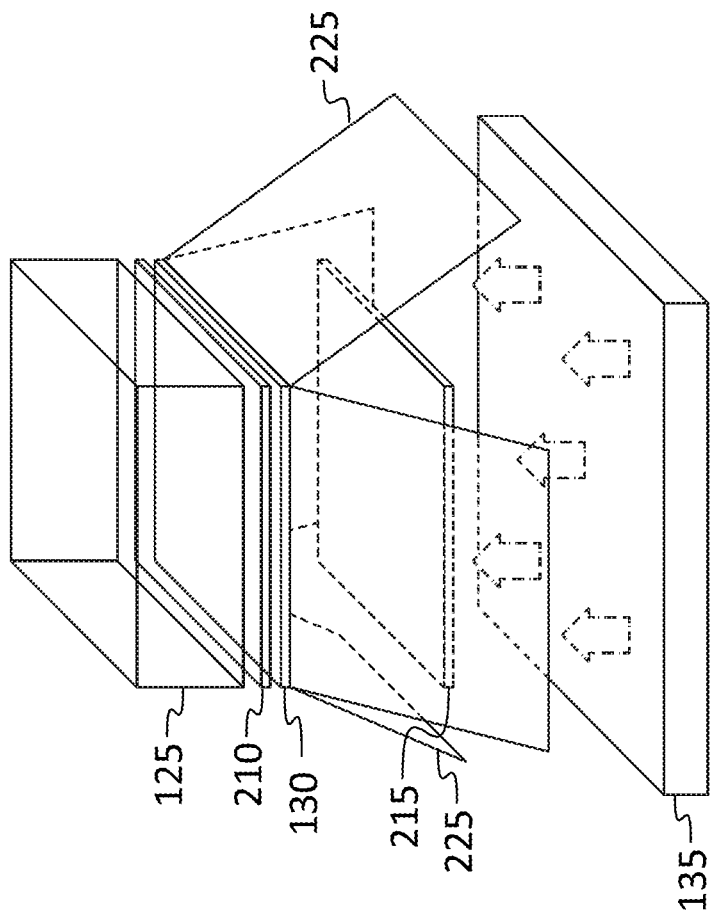
FIG. 3A is a perspective view of an apparatus for fabricating a micro-truss structure, according to an embodiment of the present invention.
Figure 3B:
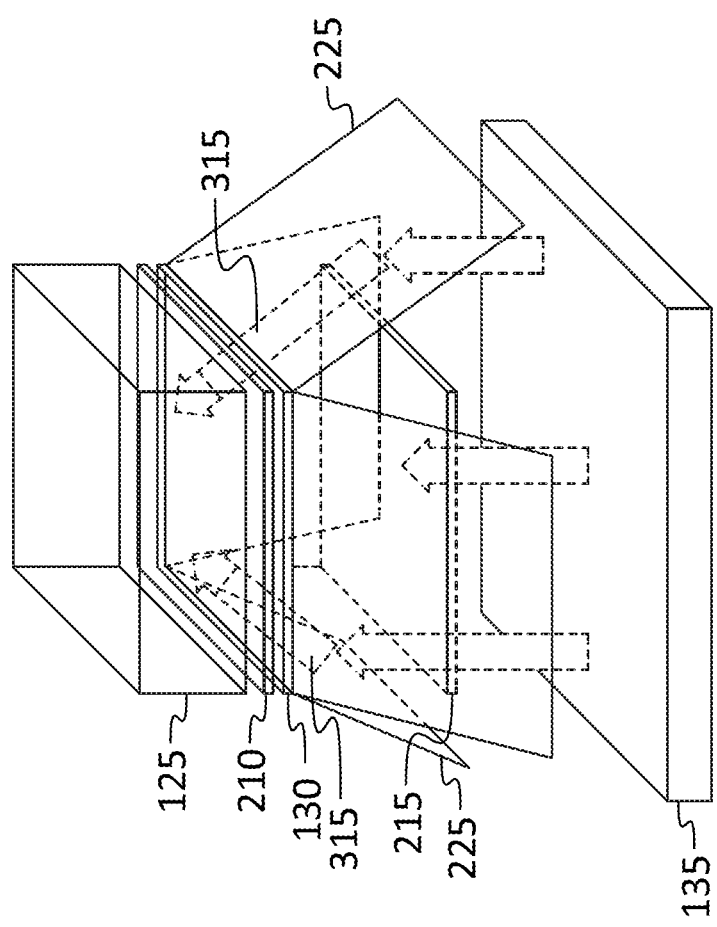
FIG. 3B is a perspective view of an apparatus for fabricating a micro-truss structure, according to an embodiment of the present invention.

FIGS. 3A and 3B shows the elements of FIGS. 2A and 2B assembled in the relative positions they may occupy when the apparatus is in operation. Collimated light emitted by the collimated light source 135 is reflected by the four mirrors 225 to form four beams 315 of collimated light, each beam being oblique to the vertical directions. The blocker 215 blocks light from propagating straight (or directly, or vertically) from the collimated light source 135 to the mask 130, so that no vertical waveguide members 110 are formed, and all of the waveguide members 110 formed in the photomonomer resin 120 are oblique to the vertical direction. The blocker may be composed of any opaque material, such as cardboard, or black cardboard. In some embodiments, the surface of the blocker is non-reflective; a non-reflective surface may simplify the avoidance of stray beams of light that may otherwise result in the formation of undesired polymer structures, in addition to the micro-truss structure, in the photomonomer resin 120.

Figure 3C:
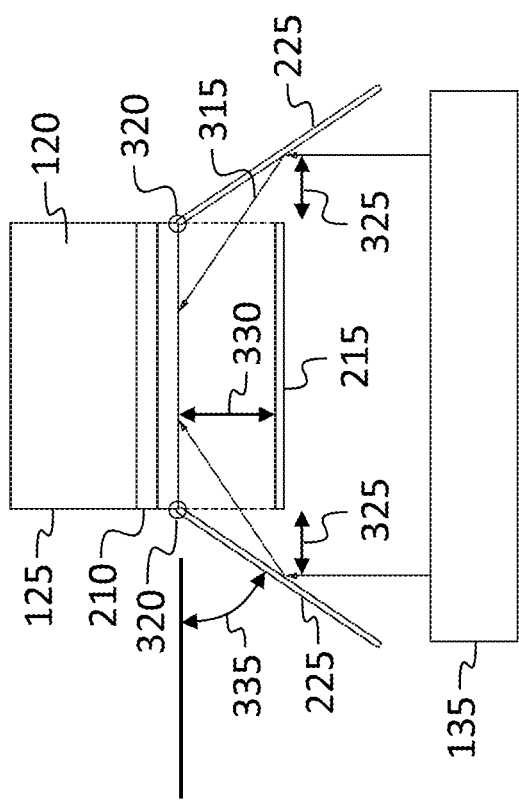
FIG. 3C is a side view of an apparatus for fabricating a micro-truss structure, according to an embodiment of the present invention.

Referring to FIG. 3C, in one embodiment, light from the collimated light source 135 radiates vertically upward and is reflected by each of the mirrors (only two of which are shown in FIG. 3C) to propagate in a direction that is oblique to the vertical direction through the mask and the substrate, and into the photomonomer resin 120 in the reservoir. A gap 325 may exist between the blocker 215 and the adjacent mirror 225 at each edge of the blocker 215, and the blocker may be positioned at a height 330 below the mask. Each mirror may be set to an angle of depression 335 that controls the direction of a respective one of the oblique beams 315 of collimated light. The width of the gap 325, the height 330 of the mask above the blocker, and the angle of depression 335 of each mirror may be selected to form a micro-truss structure of the desired size and having the desired angles of intersection between the waveguide members 110. In some embodiments the angle of depression 335 of each mirror 225 may be between 55 and 70 degrees, or between 50 and 75 degrees.

Figure 3D:
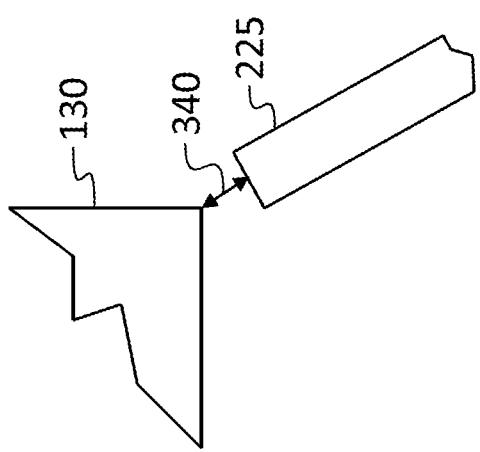
FIG. 3D is an enlarged breakaway side view of a portion of a mask and a portion of a mirror, according to an embodiment of the present invention.

Referring to FIG. 3D, in some embodiments each mirror 225 is positioned so that its upper edge is in close proximity to a corresponding edge of the mask 130. For example, each mirror 225 may be positioned so that at every point on its upper edge the width of the gap 340 to the nearest point on the mask is in the range 0.1 mm-2.0 mm (or in the range 0.0 mm-5.0 mm).

Each mirror 225 may be supported by a hinge 320 at or near the top of the mirror 225. In some embodiments each hinge 320 is sufficiently stiff (i.e., frictional resistance to rotation in the hinges is sufficient) to support the weight of the respective mirror 225 (i.e., to prevent the mirror 225 from rotating at the hinge 320 under the effect of gravity). Prior to operation of the apparatus, the angle of the mirror may be adjusted manually. To fabricate a micro-truss structure in which the waveguide members 110 intersect at common nodes (as shown, e.g., in FIG. 1A), the mirrors 225 may be installed, in the case of a four-mirror apparatus such as that of FIGS. 2A-3C, so that each mirror of each pair of opposing mirrors has an upper edge that is parallel to, and at the same height as, the other mirror of the pair of opposing mirrors. For the four-mirror apparatus, or for other embodiments (such as a three-mirror apparatus), it may be further arranged that the mirrors are adjusted so that they all have the same angle of depression 335. In one embodiment, an angle indicator (e.g., an angle indicator, available from McMaster-Carr (mcmaster.com), such as a Mini Digital Angle Indicator) is used to measure the angle of depression 335 of each mirror as it is being adjusted. In other embodiments the friction in each of the hinges 320 is sufficiently low that it is insufficient to support the weight of the respective mirror 225 at a depression angle of 75 degrees or less, and a screw threaded through a threaded hole in the frame supporting the mirror is turned to abut and press against a lower surface of the mirror 225 or of the hinge 320, to lift the mirror and decrease the angle of depression 335 as the screw is turned.

Figure 4A:
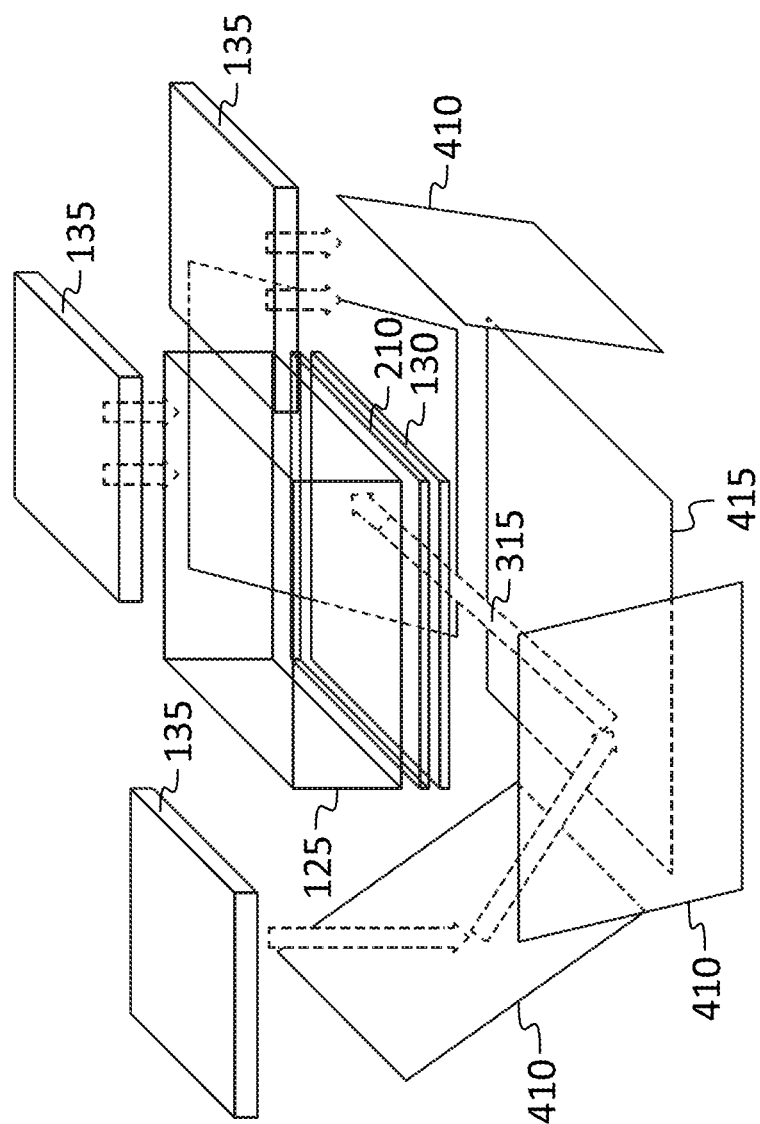
FIG. 4A is a perspective view of an apparatus for fabricating a micro-truss structure, according to an embodiment of the present invention.
Figure 4B:
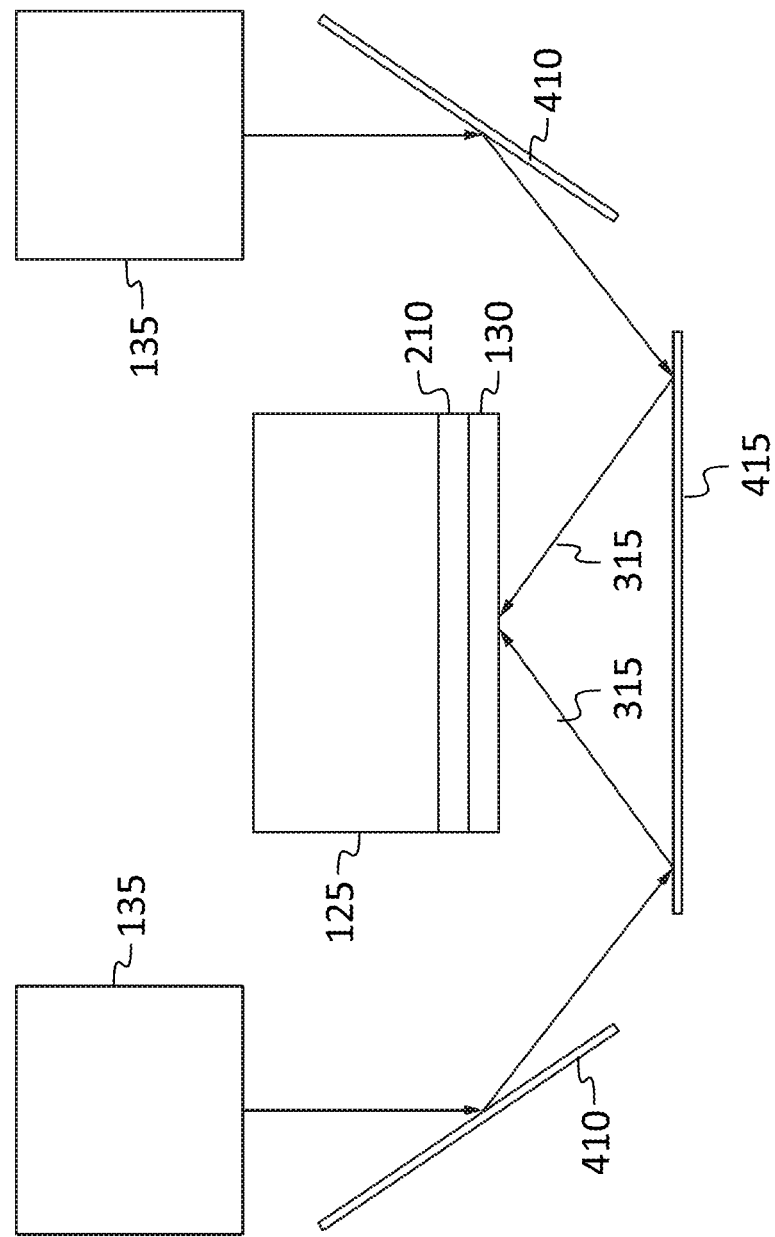
FIG. 4B is a side view of an apparatus for fabricating a micro-truss structure, according to an embodiment of the present invention.

Referring to FIGS. 4A and 4B, in another embodiment, four collimated light sources 135 (of which three are shown in FIG. 4A, and two are shown in FIG. 4B) are arranged to radiate light downwards. The beam of collimated light from each of the collimated light sources 135 is reflected once by a respective one of four first mirrors 410 and then a second time by a shared second mirror 415 (or by multiple respective second mirrors), to form four oblique beams 315 of collimated light (of which one is shown in FIG. 4A). The four oblique beams may include two pairs of oblique beams each including a first oblique beam and a second oblique beam (originating from light sources on opposite sides of the reservoir), the first and second oblique beams having the same elevation angle, and defining a vertical plane (i.e., a plane having a horizontal normal vector).

In the embodiment of FIGS. 4A and 4B, the blocker 215 may be absent. In FIGS. 4A and 4B the mirrors 410, 415 are illustrated as first surface mirrors; in other embodiments they are second surface mirrors each fabricated on a plate that is transparent to light (e.g., UV light) produced by the collimated light sources 135.

Figure 5A:
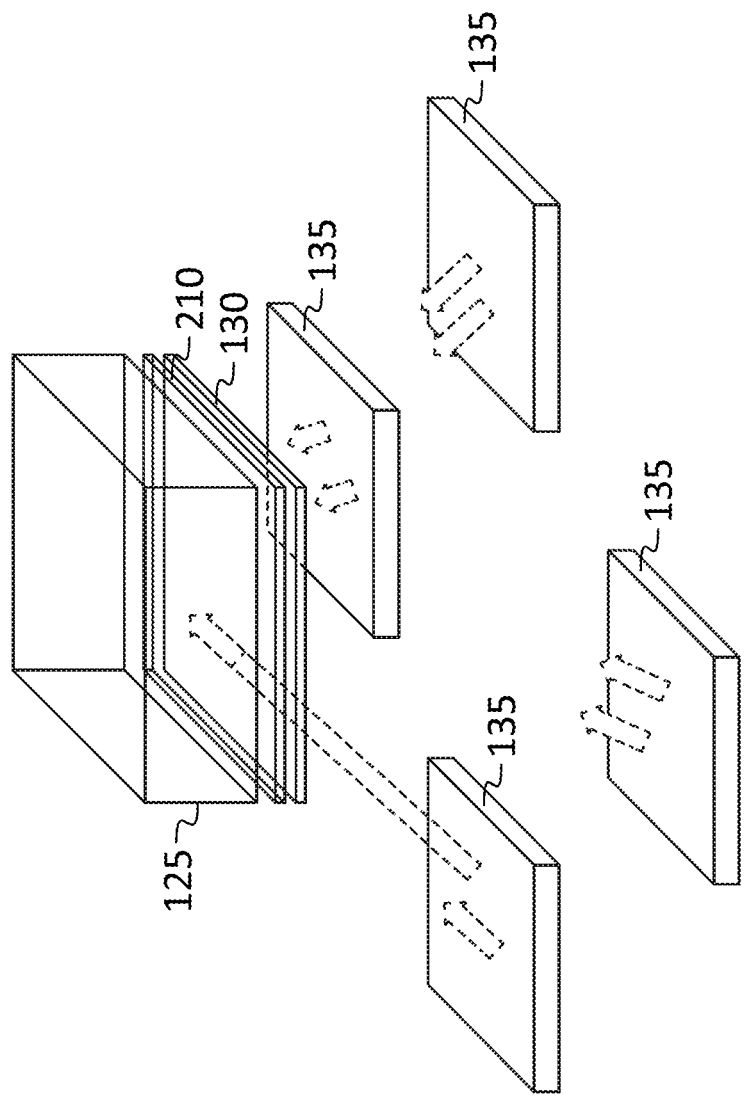
FIG. 5A is a perspective view of an apparatus for fabricating a micro-truss structure, according to an embodiment of the present invention.
Figure 5B:
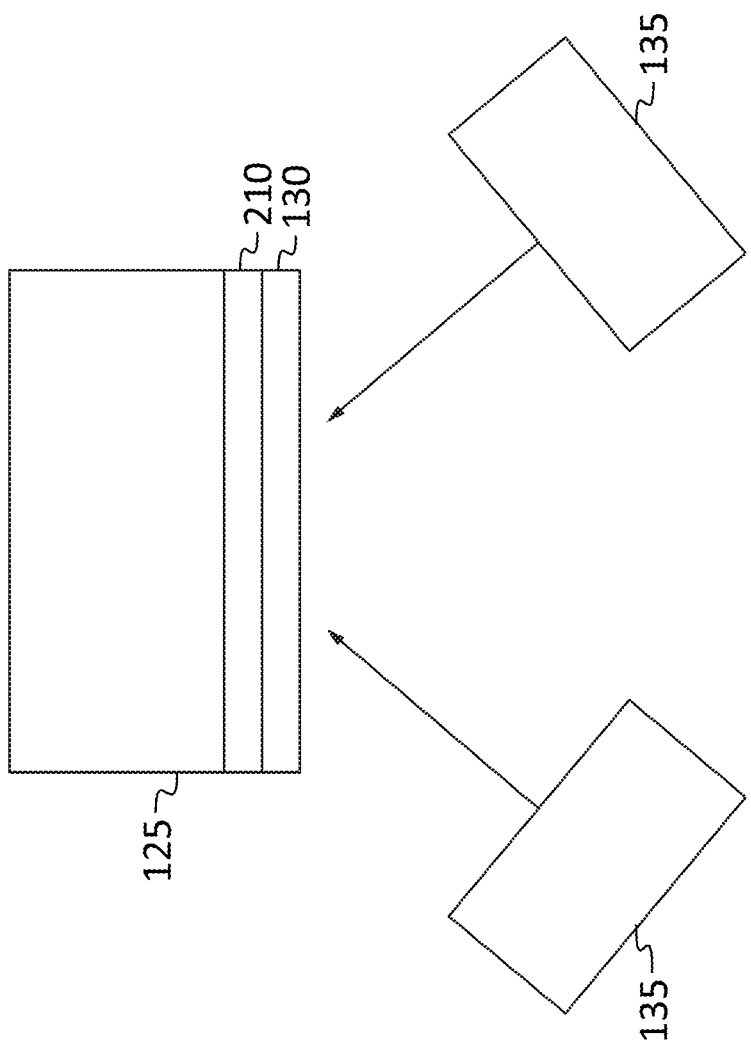
FIG. 5B is a side view of an apparatus for fabricating a micro-truss structure, according to an embodiment of the present invention.

Referring to FIGS. 5A and 5B, in another embodiment, four collimated light sources 135 (of which two are shown in FIG. 5A) are arranged to radiate oblique beams 315 of collimated light directly through the mask 130 into the photomonomer resin 120. As in the embodiment of FIGS.

4A and 4B, the blocker 215 may be absent from the embodiment of FIGS. 5A and 5B.

In summary, in some embodiments, a reservoir holds a volume of a liquid photomonomer configured to polymerize to form a photopolymer when exposed to suitable light such as ultraviolet light. A mask at the bottom of the reservoir includes a plurality of apertures. Light enters the reservoir through each aperture from several directions, forming a plurality of self-guided photopolymer waveguides within the reservoir. The light is supplied by one or more sources of collimated light. A plurality of mirrors may reflect the light from a single source of collimated light to form a plurality of collimated beams, that illuminate the photomonomer in the reservoir, through the mask, from a corresponding plurality of directions, to form, in the reservoir, a micro-truss structure including a plurality of self-guided waveguide members.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of" when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a bottom up apparatus design for formation of self-propagating photopolymer waveguides have been specifically described and illustrated herein, many modifications and variations will be apparent to those skilled in the art. Accordingly, it is to be understood that a bottom up apparatus design for formation of self-propagating photopolymer waveguides constructed according to principles of this invention may be embodied other than as specifically described herein. The invention is also defined in the following claims, and equivalents thereof.

What is claimed is:

1. A system for forming a micro-truss structure, the system comprising:
    a reservoir having walls and a flat bottom, configured to hold a volume of a liquid photo-monomer, the photo-monomer being configured to form a photopolymer when exposed to light;
    a partially transparent mask secured to, or being, the bottom of the reservoir;
    a release layer on the mask, the release layer being configured to resist adhesion by the photopolymer;
    a first light source configured to radiate collimated light, suitable for causing conversion of the photomonomer into the photopolymer, vertically downward;
    a first mirror, configured to reflect light from the first light source into a first direction;
    a second mirror, configured to reflect light from the first direction into a second direction that is neither vertical nor horizontal, through the mask and into the reservoir;

a second light source configured to radiate collimated light, suitable for causing conversion of the photomonomer into the photopolymer, vertically downward; and a third mirror, configured to reflect light from the second light source into a third direction, the second mirror being further configured to reflect light from the third direction into a fourth direction that is neither vertical nor horizontal, through the mask and into the reservoir, a plane containing the second direction and the fourth direction being vertical, and an elevation angle of the fourth direction being the same as an elevation angle of the second direction.

2. The system of claim 1, further comprising:

a third light source configured to radiate collimated light, suitable for causing conversion of the photomonomer into the photopolymer, vertically downward;

a fourth mirror, configured to reflect light from the third light source into a fifth direction;

a fourth light source configured to radiate collimated light, suitable for causing conversion of the photomonomer into the photopolymer, vertically downward; and a fifth mirror, configured to reflect light from the fourth light source, into a sixth direction, the second mirror being further configured:

to reflect the light from the fifth direction into a seventh direction that is neither vertical nor horizontal, through the mask and into the reservoir, and to reflect the light from the sixth direction into an eighth direction that is neither vertical nor horizontal, through the mask and into the reservoir, a plane containing the seventh direction and the eighth direction being vertical, and an elevation angle of the seventh direction being the same as an elevation angle of the eighth direction.

3. The system of claim 1, wherein the second mirror is fixed with respect to the reservoir.

4. The system of claim 1, wherein the second mirror is parallel to the mask.

* * * * *